(12) United States Patent
Kaji et al.

(10) Patent No.: US 7,688,874 B2
(45) Date of Patent: Mar. 30, 2010

(54) SEMICONDUCTOR LASER DRIVING DEVICE, OPTICAL HEAD, OPTICAL DISK DEVICE, AND SEMICONDUCTOR LASER DRIVING METHOD

(75) Inventors: Nobuaki Kaji, Yokohama (JP); Kazuo Watabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 25 days.

(21) Appl. No.: 11/964,329

(22) Filed: Dec. 26, 2007

(65) Prior Publication Data

US 2008/0159349 A1 Jul. 3, 2008

(30) Foreign Application Priority Data

Dec. 27, 2006 (JP) ............................... 2006-353367

(51) Int. Cl.
*H01S 3/00* (2006.01)

(52) U.S. Cl. ................................. 372/38.02; 372/38.07

(58) Field of Classification Search .............. 372/38.02, 372/20; 369/53.26; 257/421; 398/208
See application file for complete search history.

(56) References Cited

U.S. PATENT DOCUMENTS

| | | | |
|---|---|---|---|
| 5,848,044 A | | 12/1998 | Taguchi et al. |
| 5,889,801 A | * | 3/1999 | Kato et al. ..................... 372/20 |
| 5,999,550 A | * | 12/1999 | Bellemore et al. ........ 372/38.02 |
| 6,111,901 A | | 8/2000 | Taguchi et al. |
| 6,567,440 B1 | | 5/2003 | Hirata et al. |
| 6,580,737 B1 | | 6/2003 | Hirata et al. |
| 6,614,820 B2 | | 9/2003 | Hirata et al. |
| 7,095,764 B2 | | 8/2006 | Sato et al. |
| 7,324,572 B2 | * | 1/2008 | Chang ..................... 372/38.02 |
| 2006/0007971 A1 | * | 1/2006 | Sato et al. ................. 372/38.02 |
| 2007/0053395 A1 | * | 3/2007 | Kamatani et al. ........ 372/38.02 |

FOREIGN PATENT DOCUMENTS

| | | |
|---|---|---|
| EP | 0 762 574 A1 | 3/1997 |
| JP | 5-128571 | 5/1993 |
| JP | 9-121068 | 5/1997 |
| JP | 11-54826 | 2/1999 |
| JP | 2002-123963 | 4/2002 |
| JP | 2005-136155 | 5/2005 |
| JP | 2005-209988 | 8/2005 |
| JP | 2006-24275 | 1/2006 |
| JP | 2006-134422 | 5/2006 |
| KR | 10-0210982 | 7/1999 |
| KR | 10-2006-0049921 | 5/2006 |

* cited by examiner

*Primary Examiner*—Minsun Harvey
*Assistant Examiner*—Tuan N. Nguyen
(74) *Attorney, Agent, or Firm*—Oblon, Spivak, McClelland, Maier & Neustadt, L.L.P.

(57) ABSTRACT

A semiconductor laser driving device includes a current supply unit supplying current to a semiconductor laser; a first control unit controlling the current supply unit to supply a first current which is half or less of a lasing threshold of the semiconductor laser; and a second control unit controlling the current supply unit to supply a second current which is larger than the lasing threshold after a first time is passed from an edge of a clock signal.

6 Claims, 5 Drawing Sheets

SEMICONDUCTOR LASER DRIVING DEVICE, OPTICAL HEAD, OPTICAL DISK DEVICE, AND SEMICONDUCTOR LASER DRIVING METHOD

CROSS-REFERENCE TO RELATED APPLICATIONS

This application is based upon and claims the benefit of priority from the prior Japanese Patent Application No. 2006-353367, filed on Dec. 27, 2006; the entire contents of which are incorporated herein by reference.

BACKGROUND OF THE INVENTION

1. Field of the Invention

The present invention relates to a semiconductor laser driving device driving a semiconductor laser, an optical head, an optical disk device, and a semiconductor laser driving method.

2. Description of the Related Art

There is a case when data are written to an optical disk at high speed. In this case, laser light from a semiconductor laser is irradiated to the optical disk which rotates at higher speed than usual. At this time, the semiconductor laser is driven so that the laser light with short pulse and high intensity is to be radiated. Here, an art in which a drive current of the semiconductor laser is changed from a lasing threshold or less to the lasing threshold or more is disclosed (refer to JP-A 2002-123963 (KOKAI)). In this art, a relaxation oscillation is used for the driving of the semiconductor laser.

BRIEF SUMMARY OF THE INVENTION

It is necessary to control intensity of the laser light even when the relaxation oscillation of the semiconductor laser is used. In consideration of the above, an object of the present invention is to provide a semiconductor laser driving device, an optical head, an optical disk device, and a semiconductor laser driving method in which the control of the intensity of the laser light at the relaxation oscillation is easy.

A semiconductor laser driving device according to an aspect of the present invention, includes: a current supply unit supplying current to a semiconductor laser; a first control unit controlling the current supply unit to supply a first current which is half or less of a lasing threshold of the semiconductor laser; and a second control unit controlling the current supply unit to supply a second current which is larger than the lasing threshold after a first time is passed from an edge of a clock signal.

A semiconductor laser driving method according to an aspect of the present invention, includes: supplying a first current which is half or less of a lasing threshold to a semiconductor laser; and supplying a second current which is larger than the lasing threshold to the semiconductor laser after a first time is passed from an edge of a clock signal.

DETAILED DESCRIPTION OF THE INVENTION

Figure 1:
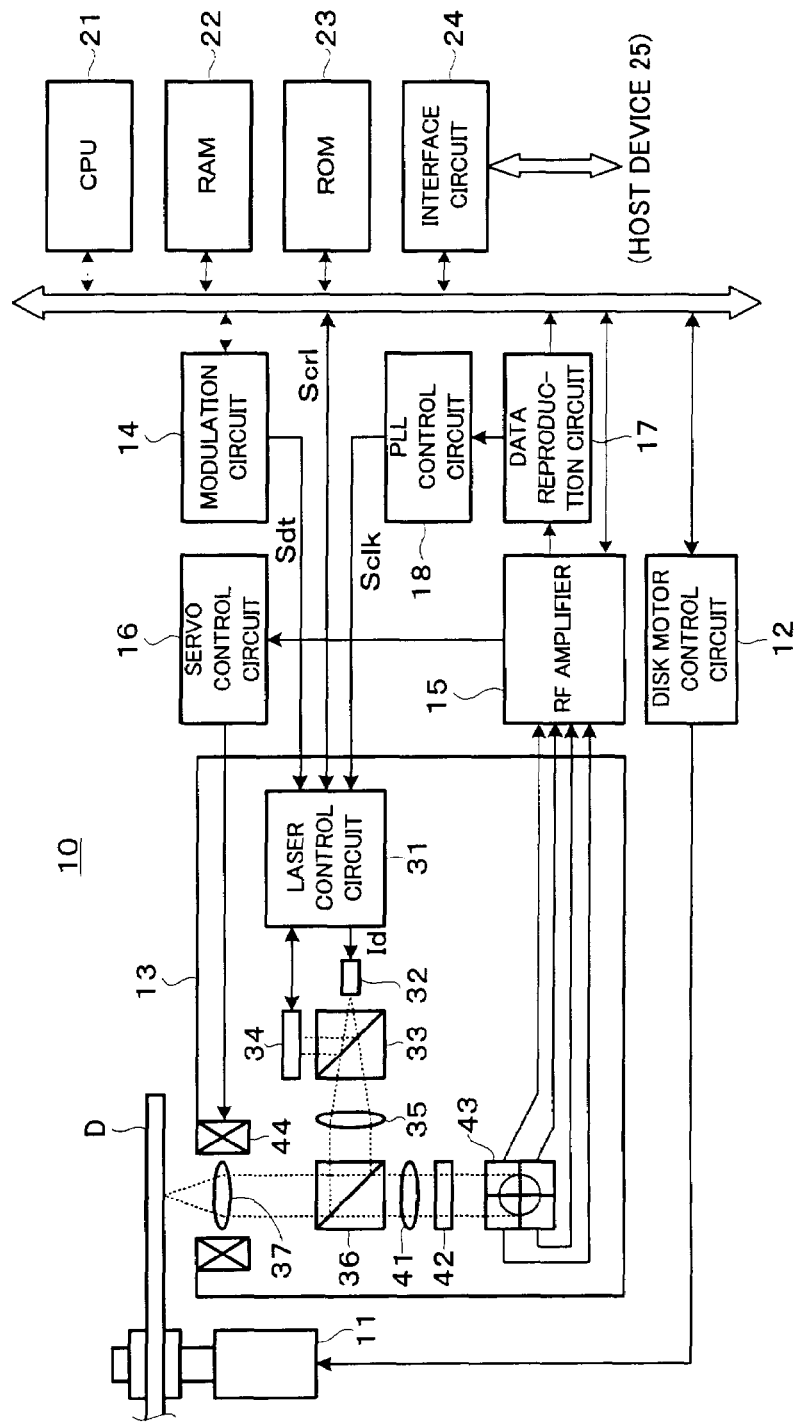
FIG. 1 is a block diagram showing an optical disk device according to an embodiment of the present invention.

Hereinafter, embodiments of the present invention are described in detail with reference to the drawings. FIG. 1 is a block diagram showing an optical disk device 10 according to an embodiment of the present invention. The optical disk device 10 records and reproduces information to/from an optical disk D.

The optical disk D is, for example, an information storage medium such as a DVD (Digital Versatile Disc), HD-DVD. Grooves are formed on the optical disk D in a concentric state or in a spiral state. A circle of this groove is called as a track. Marks (bit and so on) are formed by irradiating intensity modulated laser light along this track, and thereby, user data are recorded. The laser light which is weaker than the laser light at the recording time is irradiated along the track when the data are reproduced. Changes of reflected light intensity from the marks on the track are detected, and thereby, the data are reproduced.

The optical disk D is rotationally driven by a disk motor 11. The disk motor 11 is controlled by a disk motor control circuit 12. An optical head 13 records and reproduces information to the optical disk D.

The user data are supplied to a modulation circuit 14 from a host device 25 via an interface circuit 24 at the time of information recording (at the time of mark formation). The modulation circuit 14 performs EFM modulation (for example, 8-14 modulation) on the user data, to output to a laser control circuit 31 as a data signal Sdt.

The laser control circuit 31 supplies a write current (drive current Id) to a semiconductor laser (laser diode) 32 based on the data signal Sdt supplied from the modulation circuit 14. At this time, a clock signal Sc1K form a PLL circuit 76, a control signal Scr1 from a CPU 21 are used. At the time of information reading, the laser control circuit 31 supplies a read current which is smaller than the write current to the semiconductor laser 32. Incidentally, details of the laser control circuit 31 are described later.

A front monitor 34 detects intensity of laser light, namely, light-emission power generated by the semiconductor laser 32, and supplies the detected current to the laser control circuit 31. The laser control circuit 31 controls the semiconductor laser 32 based on the detected current from the front monitor 34. As a result, the semiconductor laser 32 emits light with a laser power at a reproduction time, and a laser power at a recording time which are set by the CPU 21.

The laser light emitted from the semiconductor laser 32 is irradiated on the optical disk D via a half transmittance prism 33, a collimator lens 35, a half transmittance prism 36, and an objective lens 37. The reflected light from the optical disk D is guided to an optical detector 43 via the objective lens 37, the half transmittance prism 36, a condenser lens 41, and a cylindrical lens 42. The optical detector 43 is composed of, for example, four-divided optical detection cells, and detection signals of these optical detection cells are outputted to an RF amplifier 15.

The RF amplifier 15 processes the signals from the optical detection cells, and generates a focus error signal FE, a tracking error signal TE, and an RF signal. The focus error signal FE shows a deviation (error) from just focus. The tracking error signal TE shows a deviation (error) between a beam spot center of the laser light and a track center. The RF signal is a signal in which all of the signals from the optical detection cells are added, and the reflected light from the mark formed on the track of the optical disk D is reflected. The RF signal is supplied to a data reproduction circuit 17, and the data are reproduced.

The focus error signal FE, the tracking error signal TE are supplied to a servo control circuit 16, and a focus drive signal and a track drive signal are generated. The focus drive signal and the track drive signal are supplied to a drive coil 44, and the objective lens 37 is moved in a focusing direction (an optical axis direction of the lens) and in a tracking direction (a direction orthogonal to the optical axis of the lens). As a result of this, a focus servo (the laser light is always in a just focus state on a recording film of the optical disk D), a tracking servo (the laser light is always tracing on the tracks formed on the optical disk D) are performed.

The CPU 21 comprehensively controls the optical disk device 10 in accordance with operation commands provided by the host device 25 via the interface circuit 24. The CPU 21 uses a RAM 22 as a work area, and operates in accordance with control programs stored on a ROM 23.

(Details of Laser Control Circuit 31)

Hereinafter, details of the laser control circuit 31 are described.

A laser drive circuit 55 radiates laser light with high light intensity and short pulse width from the semiconductor laser 32 by using a relaxation oscillation of the semiconductor laser 32. As a result of this, a high-speed recording to the optical disk D becomes possible.

It is necessary to irradiate the laser light with short pulse width on the optical disk D when the recording is performed to the optical disk D with high double speed. For example, when data is recorded to an HD-DVD (HD-DVD-R, HD-DVD-RW, and so on) with 8 double speed (52.9 m/sec), the irradiation of the laser light with a pulse width of approximately 1 ns or less is required. This pulse width is defined by a length of a minimum-length mark (2T) (for example, 0.18 μm) and a rotation speed of the optical disk.

When the laser light has the short pulse width, an integrated value of irradiated energy becomes small, and there is a possibility that the mark cannot be recorded. Accordingly, it is necessary to increase the intensity of the laser light (laser power P0) in accordance with the shortening of the pulse width (increase of rotation speed of the optical disk). Namely, it is necessary to generate the laser light with high intensity and short pulse width from the semiconductor laser 32.

It becomes possible to obtain a laser output with high intensity and short pulse width from the semiconductor laser 32 by using the relaxation oscillation of the semiconductor laser 32. When the drive current Id of the semiconductor laser 32 is changed (risen) drastically from a value smaller than a lasing threshold Ith to the lasing threshold Ith or more, the relaxation oscillation of the laser light is generated at the semiconductor laser 32. A rising time of the drive current Id is made smaller than a cycle of the relaxation oscillation, and thereby, the relaxation oscillation is generated at the semiconductor laser 32. As a result of this, the laser light with high intensity and short pulse width is radiated from the semiconductor laser 32.

A. Internal Configuration of Laser Control Circuit 31

Figure 2:
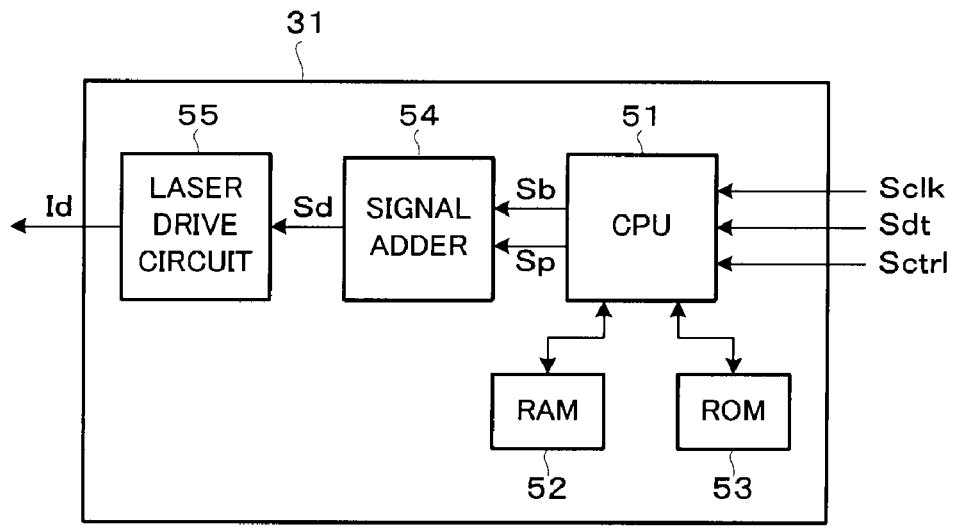
FIG. 2 is a block diagram showing an internal configuration of a laser control circuit.
Figure 3:
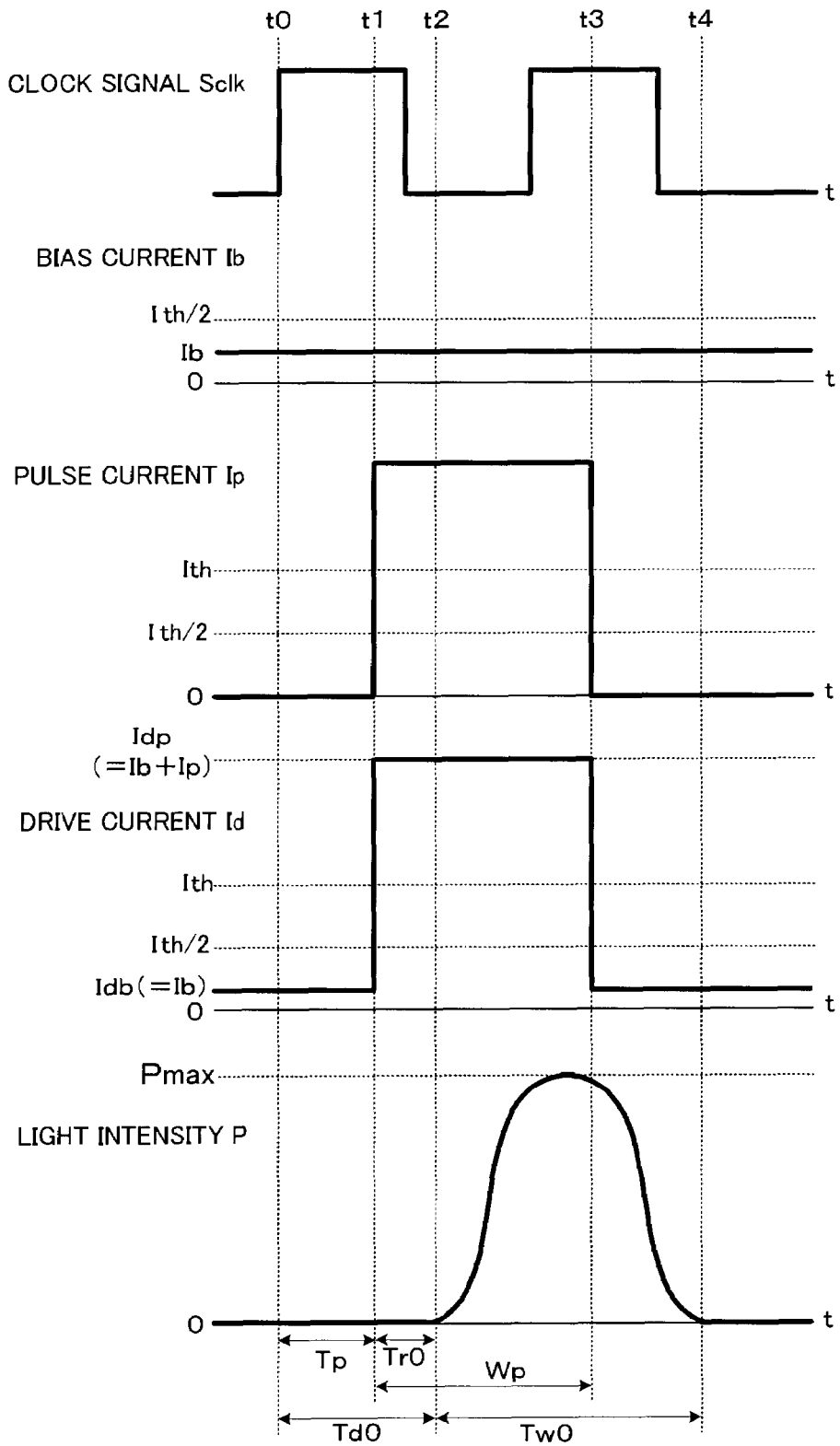
FIG. 3 is a timing chart showing a relation of signals inside of the laser control circuit.

Hereinafter, an internal configuration of the laser control circuit 31 is described. FIG. 2 is a block diagram showing the internal configuration of the laser control circuit 31. FIG. 3 is a timing chart showing a relation of signals inside of the laser control circuit 31. Incidentally, a mechanism enabling a control of the semiconductor laser 32 by the front monitor 34 is not shown in FIG. 2.

The laser control circuit 31 has a CPU 51, a RAM 52, a ROM 53, a signal adder 54 and the laser drive circuit 55, and functions as a semiconductor laser driving device.

The CPU 51 integratedly controls the laser control circuit 31. The CPU 51 calculates the laser power P0, a record delay time Td0, and a record time Tw0 based on the data signal Sdt, the control signal Scrl. A write strategy stored in the ROM 53 is used for this calculation. Besides, the CPU 51 derives a bias current Ib, a pulse current Ip, a pulse current width Wp, and a pulse delay time Tp based on the laser power P0, the record delay time Td0. A table TT inside of the ROM 53 is used for this derivation.

The CPU 51 controls a current supply unit, and functions as a control unit supplying current to the semiconductor laser 32. Besides, the CPU 51 functions as a decision unit deciding a second current (pulse current Ip).

The laser power P0 is the intensity of the laser light required for the writing of the mark by the semiconductor laser 32. The record delay time Td0 is the time from a rising (edge) of the clock signal Sclk to a start of the laser irradiation, and it is a parameter to adjust a record position of the mark. The record time Tw0 is the time when the semiconductor laser 32 emits light, and it is a parameter to define the length of the mark. The pulse delay time Tp is the time from the edge (rising) of the clock signal Sclk to the rising of the pulse current Ip.

The RAM 52 is a storage device for work of the CPU 51. The ROM 53 stores the table TT to derive a bias current Ib and so on. The bias current Ib, the pulse current Ip, the pulse current width Wp, and the pulse delay time Tp, which are corresponding to a combination of the laser power P0, the record delay time Td0 are shown in the table TT. Besides, the ROM 53 stores the write strategy to derive the laser power P0 and so on from the data signal Sdt and so on.

The signal adder 54 adds a bias signal Sb and a pulse signal Sp outputted from the CPU 51, and outputs a result to the laser drive circuit 55 as a drive signal Sd.

The laser drive circuit 55 performs a voltage-current conversion of the drive signal Sd, and outputs a result the semiconductor laser 32 as the drive current Id. The semiconductor laser 32 emits light based on the drive current Id. The laser drive circuit 55 functions as the current supply unit supplying the current to the semiconductor laser 32.

B. Timings of Signals at Laser Control Circuit 31

Hereinafter, timings of signals at the laser control circuit 31 are described based on FIG. 3.

(1) The bias current Ib is applied to the semiconductor laser 32 regardless of the clock signal Sclk at the time of the writing to the optical disk D. However, a value thereof is changed appropriately.

(2) The pulse current Ip is applied to the semiconductor laser 32 when the pulse delay time Tp is passed (time t1) from the edge of the clock signal Sclk (time t0). At this time, the pulse delay time Tp, the pulse current Ip, the pulse current width Wp are changed appropriately.

(3) The drive current Id is a sum of the bias current Ib and the pulse current Ip. When there is only the bias current Ib, the drive current Id of the semiconductor laser 32 (bias drive current Idb) is equal to the bias current Ib (Idb=Ib). The drive current Id of the semiconductor laser 32 when the pulse current Ip is applied (pulse drive current Idp) is equal to the sum of the bias current Ib and the pulse current Ip (Idp=Ib+Ip).

(4) The stimulated-light-emission from the semiconductor laser 32 is started after a light-emission delay time Tr0 is passed (time t2) from the rising of the drive current Id (time t1). In case of the relaxation oscillation, the light-emission delay time Tr0 exists. As a result of this, the light-emission from the semiconductor laser 32 is started after the record delay time Td0 (=Tp+Tr0) is passed from the edge of the clock signal Sclk (time t0), and the light-emission continues during the record time Tw0 (=t4−t2) with corresponding to the pulse current width Wp (=t3−t1). During this light-emission, the intensity of the laser light changes temporally, and reaches the maximum value (maximum light intensity) Pmax. This maximum light intensity Pmax corresponds to the laser power P0. However, these values are not necessarily to be identical.

C. Operation Procedure of Laser Control Circuit 31

Figure 4:
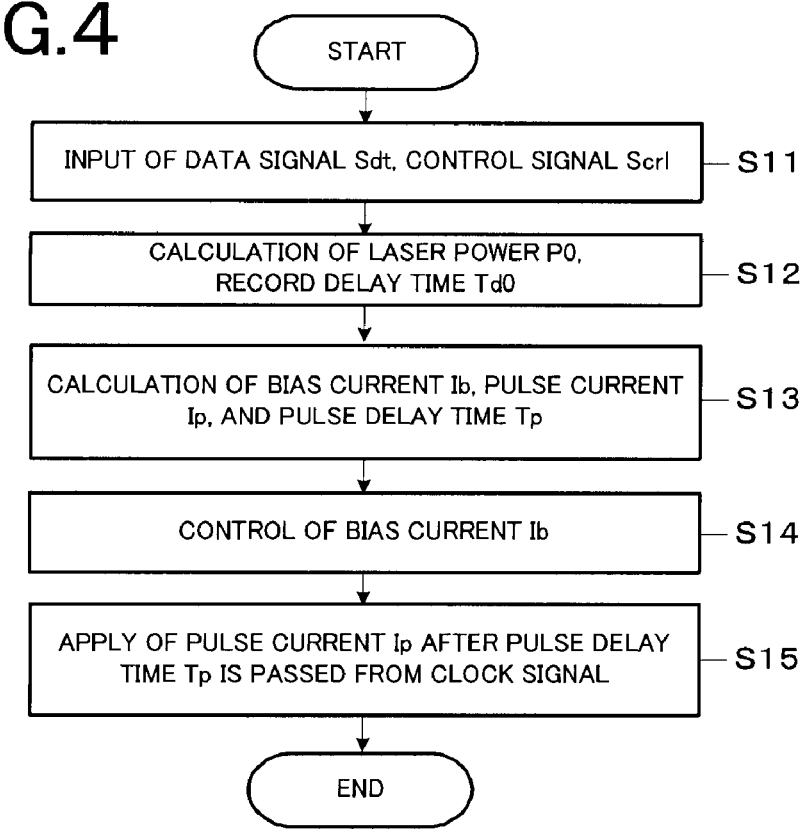
FIG. 4 is a flowchart showing an example of an operation procedure of the laser control circuit.

Hereinafter, an operation procedure of the laser control circuit 31 is described. FIG. 4 is a flowchart showing an example of the operation procedure of the laser control circuit 31.

(1) Input of Data Signal Sdt, Control Signal Scr1 (Step S11)

As it is already mentioned previously, when the mark is recorded on the optical disk D, the data signal Sdt, the control signal Scr1 are inputted to the laser control circuit 31.

(2) Calculation of Laser Power P0, Record Delay Time Td0 and Record Time Tw0 (Step S12)

The CPU 51 calculates the laser power P0, the record delay time Td0, and the record time Tw0 from the data signal Sdt and the control signal Scr1. This calculation is based on the write strategy inside of the ROM 53.

(3) Calculation of Bias Current Ib, Pulse Current Ip, Pulse Current Width Wp, and Pulse Delay Time Tp (Step S13)

The CPU 51 derives the bias current Ib, the pulse current Ip, the pulse current width Wp, and the pulse delay time Tp based on the laser power P0, the record delay time Td0, and the record time Tw0. The table TT inside of the ROM 53 is used for these derivations. This derivation may be divided as shown by the following 1) to 3).

1) Calculation of Pulse Delay Time Tp, Bias Current Ib

The pulse delay time Tp, the bias current Ib are calculated from the record delay time Td0. In case of the relaxation oscillation, time is required from the rising of the pulse current Ip to the start of the light-emission of the semiconductor laser 32 (light-emission delay time Tr0). As a result of this, it is necessary to consider both of these pulse delay time Tp and the light-emission delay time Tr0 for the record delay time Td0 (Td0=Tp+Tr0). The record delay time Td0 depends on both the pulse delay time Tp and the bias current Ib because the light-emission delay time Tr0 depends on the bias current Ib.

It is relatively easy to electrically control the pulse delay time Tp. On the contrary, the light-emission delay time Tr0 is not able to vary largely because there is a limit in a variation of the bias current Ib (Ib is necessary to be half or less of the lasing threshold Ith, as stated below). On the contrary, it is possible to use the light-emission delay time Tr0 to finely adjust the record delay time Td0. Namely, it is possible to position each of the pulse delay time Tp, the light-emission delay time Tr0 as a rough adjustment and fine adjustment of the record delay time Td0. For example, the pulse delay time Tp is changed step by step, and the record delay time Td0 is finely adjusted by the light-emission delay time Tr0. Incidentally, it is also possible to fix one of the pulse delay time Tp, the light-emission delay time Tr0. For example, the pulse delay time Tp is changed by the write strategy, and a jitter of the record delay time Td0 can be lowered.

The larger the bias current Ib becomes, the smaller the light-emission delay time Tr0 becomes. Namely, there is a relation as stated below between bias currents Ib1, Ib2, and light-emission delay times Tr01, Tr02 respectively corresponding to the bias currents Ib1, Ib2.

If Ib1<Ib2, then Tr01>Tr02

Here, it is preferable that the bias current Ib is set to be half or less of the lasing threshold (threshold current) Ith of the semiconductor laser 32. When the bias current Ib is larger than the half of the lasing threshold Ith, the relaxation oscillation becomes small and the outputted laser power P0 becomes small. In this case, there is a possibility that the laser power required for the record of the mark to the optical disk D cannot be obtained, and the mark is not formed. Even though the mark is recorded, the shape thereof becomes small, and a quality of the mark deteriorates.

Figure 5:
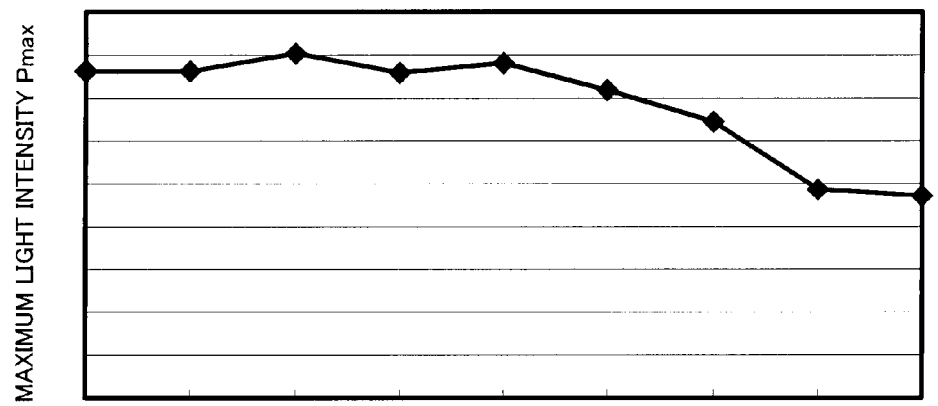
FIG. 5 is a view showing a maximum power of a relaxation oscillation.

FIG. 5 is a view showing the maximum light intensity Pmax when the pulse drive current Idp is set to 70 mA and the bias current Ib and the pulse current Ip are changed. The maximum light intensity Pmax is approximately constant when the bias current Ib is approximately less or equal to the half (20 mA) of the lasing threshold Ith (40 mA). However, the maximum light intensity Pmax decreases when the bias current Ib is larger than the half of the lasing threshold Ith. As stated above, it is desirable that the bias current Ib is set to be the half or less of the lasing threshold Ith to record to the optical disk D.

2) Calculation of Pulse Current Ip

The pulse drive current Idp is calculated from the laser power P0(=Pmax), in case the bias current Ib is approximately less or equal to the half of the lasing threshold Ith, Because the laser power P0 is only influenced by the pulse drive current Idp. Namely, the pulse drive current Idp can be defined by the laser power P0 as shown in the expression (1).

$$Idp = Ik \qquad \text{expression (1)}$$

Ik: a current value defined with corresponding to the laser power P0 of the semiconductor laser 32

From a point of view of the drive current Id, the pulse current Ip can be calculated based on the following expression (2).

$$Ik = Ip + Id \qquad \text{expression (2)}$$

In other words, when the laser power P0 is identical, a summation of the pulse current Ip and the bias current Ib becomes approximately constant. As stated above, the pulse current Ip is changed in accordance with the bias current Ib, and thereby, the change of the intensity of the laser light radiated from the semiconductor laser 32 becomes small. As a result of this, it becomes possible to record the uniform marks even when the bias current Ib is changed.

If the pulse current Ip is made constant, the power of the laser light changes when the bias current Ib changes. As a result, the size of the recorded mark on the optical disk D is changed by the bias current Ib, and the quality of the mark deteriorates. As stated above, the pulse current Ip is changed in accordance with the bias current Ib, and thereby, the uniform marks can be recorded.

3) Calculation of Pulse Current Width Wp

The pulse current width Wp is set so that only one relaxation oscillation is to be generated at the semiconductor laser 32. If the pulse current width Wp is too long, plural relaxation oscillations may be generated from the semiconductor laser 32.

Figure 6:
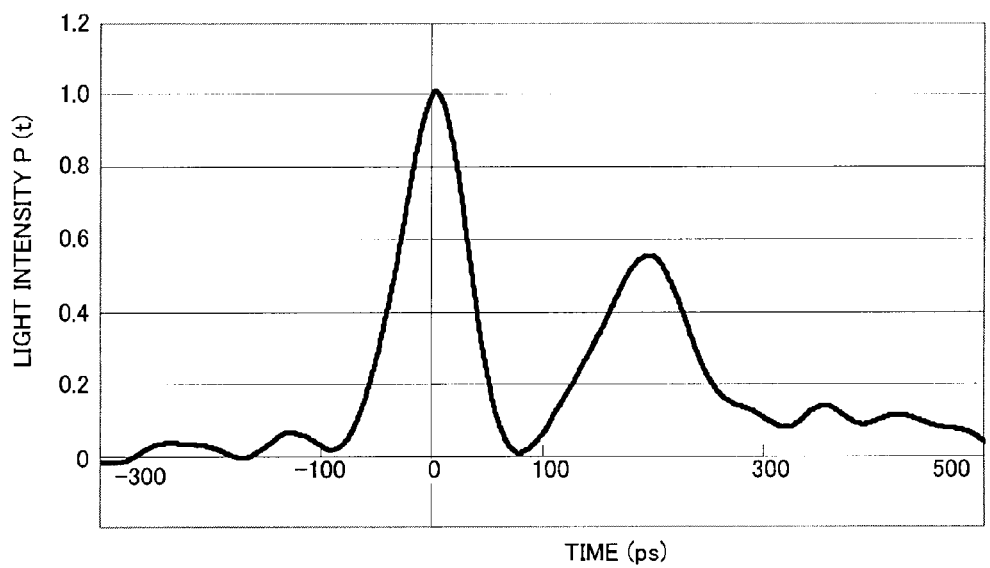
FIG. 6 is a graphic chart showing a state in which plural relaxation oscillations are generated.

FIG. 6 is a graphic chart showing a state in which the plural relaxation oscillations are generated. Plural peaks appear in the graph of time change of light intensity P(t). In this case, the pulse width of the laser light becomes long. As a result of this, the mark recorded to the optical disk D becomes long, and the record quality deteriorates. Accordingly, it is necessary to make the drive current Id to be the lasing threshold Ith or less until a first relaxation oscillation ends.

Namely, the pulse current width Wp is determined so as to satisfy the following expression (3).

$$Wp < Tr0 + T1 \qquad \text{expression (3)}$$

T1: a cycle of the relaxation oscillation (4) Control of Bias Current Ib (Step S14)

A base signal Sb (bias current Ib) outputted from the CPU 51 is controlled based on the calculation result at the step S13. For example, the bias current Ib is controlled with corresponding to the edge (rising) of the clock signal Sclk (time t0) in FIG. 3.

(5) Apply of Pulse Current Ip (Step S15)

The pulse signal Sp (pulse current Ip) outputted from the CPU 51 is controlled based on the calculation result at the step S13. For example, the pulse current Ip is risen after the pulse delay time Tp is passed from the edge (rising) of the clock signal Sclk in FIG. 3.

As stated above, the bias current Ib, the pulse current Ip are controlled, and thereby, a waveform of the drive current Id is formed, and the semiconductor laser 32 is driven in the relaxation oscillation state.

Figure 7:
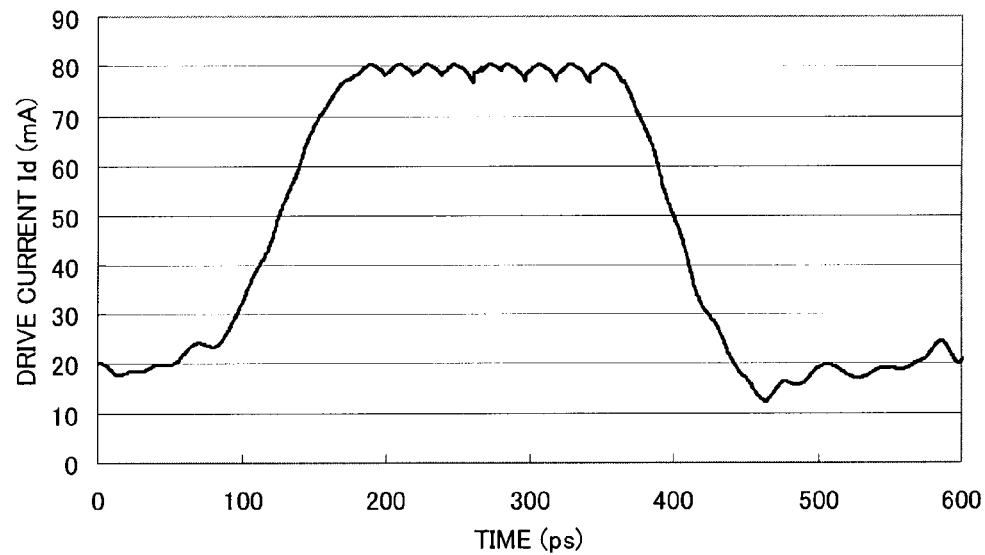
FIG. 7 is a graphic chart showing an example of a waveform of a drive current supplied to a semiconductor laser.
Figure 8:
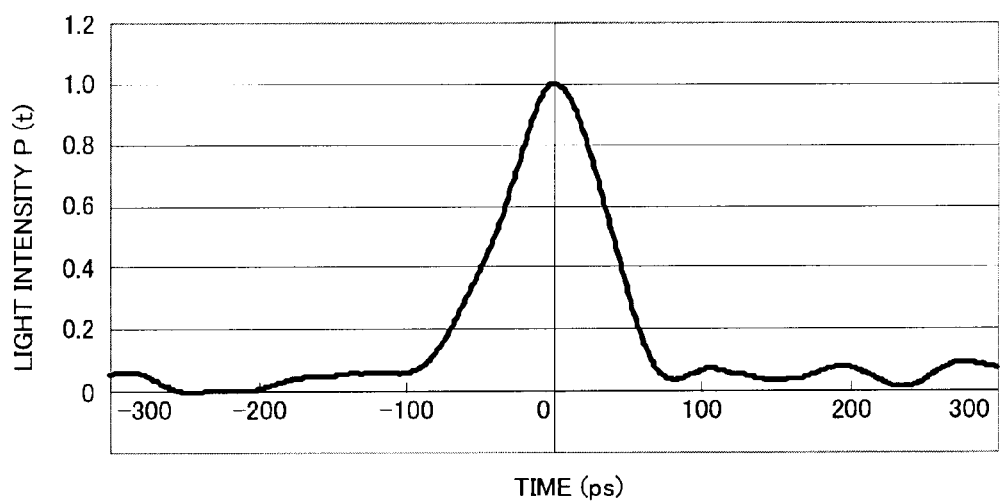
FIG. 8 is a graphic chart showing an example of a time change of light intensity outputted from the semiconductor laser.

FIG. 7 and FIG. 8 are graphic charts respectively showing examples of the waveforms of the drive current Id supplied to the semiconductor laser 32 and the time change of the light intensity P outputted from the semiconductor laser 32.

In this example, a semiconductor laser of which lasing threshold Ith is 40 mA, and laser waveform λ is 405 nm is used. The drive current Id composed of the bias current Ib of 20 mA and the pulse current Ip of which rising time is 100 ps or less is injected to the semiconductor laser (refer to FIG. 7). As a result, light-emission delay time Tr0 is 300 ps and the laser light with short pulse width (approximately 200 ps) and a large output as shown in FIG. 8 can be obtained.

Other Embodiments

Embodiments of the present invention can be expanded/modified without being limited to the above-described embodiments, and such expanded/modified embodiments are also included in the technical scope of the present invention.

What is claimed is:

1. A semiconductor laser driving device, comprising:
   a current supply unit supplying current to a semiconductor laser;
   a first control unit controlling said current supply unit to supply a first current which is half or less of a lasing threshold of the semiconductor laser;
   a second control unit controlling said current supply unit to supply a second current which is larger than the lasing threshold after a first time is passed from an edge of a clock signal;
   an input unit inputting a signal representing light-emission intensity of the semiconductor laser, and a signal representing a second time from the edge of the clock signal to a start of light-emission of the semiconductor laser;
   a first decision unit deciding the first current based on the difference between the first and second times, the first current being the half or less of the lasing threshold;
   a second decision unit deciding the sum of the first and second current based on the light-emission intensity; and
   a third decision unit deciding the second current based on the sum and the decided first current.

2. The semiconductor laser driving device according to claim 1,
   wherein the second current decided by the third decision unit is represented by the following expression,
   $$Ik = I1 + I2$$
   I1: a first current value;
   I2: a second current value;
   Ik: a current value defined with corresponding to the light-emission intensity of the semiconductor laser.

3. An optical head, comprising
   a semiconductor laser driving device according to claim 1.

4. An optical disk device, comprising
   a semiconductor laser driving device according to claim 1.

5. A semiconductor laser driving method, comprising:
   supplying a first current which is half or less of a lasing threshold to a semiconductor laser; and
   supplying a second current which is larger than the lasing threshold to the semiconductor laser after a first time is passed from an edge of a clock signal;
   inputting a signal representing light-emission intensity of the semiconductor laser, and a signal representing a second time from the edge of the clock signal to a start of light-emission of the semiconductor laser;
   deciding the first current based on the difference between the first and second times, the first current being the half or less of the lasing threshold;
   deciding the sum of the first and second current based on the light-emission intensity; and
   deciding the second current based on the sum and the decided first current.

6. The semiconductor laser driving method according to claim 5,
   wherein the decided second current is represented by the following expression,
   $$Ik = I1 + I2$$
   I1: a first current value;
   I2: a second current value;
   Ik: a current value defined with corresponding to the light-emission intensity of the semiconductor laser.

* * * * *